United States Patent [19]
Yuen

[11] Patent Number: 5,821,802
[45] Date of Patent: Oct. 13, 1998

[54] TRANSFORMER-COUPLED MIXER CIRCUIT

[75] Inventor: Gregory Weng Mun Yuen, Harlow, United Kingdom

[73] Assignee: Northern Telecom Limited, Montreal, Canada

[21] Appl. No.: 844,184

[22] Filed: Apr. 18, 1997

[51] Int. Cl.$^6$ ........................................................ G06F 7/44
[52] U.S. Cl. .......................... 327/359; 327/119; 327/123; 455/333
[58] Field of Search ...................................... 327/113, 116, 327/119–123, 355–359, 423, 588; 455/326, 333

[56] References Cited

U.S. PATENT DOCUMENTS

| 4,311,929 | 1/1982 | Konrad et al. | 327/355 |
| 4,403,156 | 9/1983 | Sakamoto | 327/355 |
| 4,636,663 | 1/1987 | Jongepier et al. | 327/355 |

OTHER PUBLICATIONS

IEEE Journal of Solid State Circuits, vol. SC3, pp. 365 to 373, Dec. 1968.
"Analysis and Design of Analogue Integrated Circuits", Third Edition, by Gray & Meyers, Wiley 1993, Figure 10.9, p. 670.

*Primary Examiner*—Timothy P. Callahan
*Assistant Examiner*—Kenneth B. Wells
*Attorney, Agent, or Firm*—John D. Crane

[57] ABSTRACT

A transformer-coupled mixer circuit including dc voltage supply; and four transistors, arranged as a first transistor pair and a second transistor pair. Each transistor pair has a first transistor and a second transistor and each transistor has a base, a collector and an emitter. The emitter of the first transistor in each transistor pair is connected to the collector of the second transistor in that transistor pair, and the emitter of the second transistor in each transistor pair is connected to a current sink. The circuit also comprises a transformer, having a set of primary windings and first and second sets of secondary windings, the first set of secondary windings being connected in series with the emitter of the first transistor in the first transistor pair and the second set of secondary windings being connected in series with the emitter of the first transistor in the second transistor pair. The windings are arranged such that outputs taken from the first and second sets of secondary windings are 180 degrees out of phase, and the primary windings of the transformer are arranged to receive an input signal. The bases of all of the transistors are arranged to receive local oscillator signals, the dc voltage applied to the second transistor in each transistor pair being less than the dc voltage applied to the first transistor in each transistor pair. Finally, the signals applied to the first transistor pair are the inverse of the signals applied to the second transistor pair, such that the local oscillator signals activate only one transistor pair at a time.

9 Claims, 6 Drawing Sheets

TRANSFORMER-COUPLED MIXER CIRCUIT

FIELD OF THE INVENTION

The invention relates to a transformer-coupled mixer circuit and in particular to a mixer circuit with enhanced signal handling capability over prior art mixer circuits.

BACKGROUND OF THE INVENTION

A mixer circuit receives inputs at two different frequencies ($f_{RF}$ and $f_{LO}$) and produces a first output at a frequency equal to the sum of the aforementioned frequencies and a second output at a frequency equal to the difference between the aforementioned input frequencies, as follows:

$$IF1 = f_{RF} - f_{LO} \text{ and } IF2 = f_{RF} + f_{LO} \tag{1}$$

Mixing is a commonly used function in, for example, communications circuits. However, the techniques used to date have shortcomings either in performance or in implementation as an integrated circuit. The conventional integrated circuit solution is to use a "Gilbert cell", as disclosed in "B Gilbert's—a precise four-quadrant multiplier with sub-nanosecond response", IEEE Journal of Solid-State Circuits, vol. SC-3, pp. 365–373, December 1968. The form of Gilbert cell circuit commonly used today is illustrated in FIG. 2. See also the explanation of the Gilbert cell in Gray and Meyer's "Analysis and Design of Analog Integrated Circuits", Third Edition, Wiley 1993, page 670–681. It can be seen from the mathematical analysis in the corresponding description in Gray and Meyers and is well known in the field that a Gilbert cell provides an output which has components at frequencies equal to both the sum of and the difference between the input signal frequencies, as follows:

$$V_0(t) = K \sum_{n=1}^{\infty} \frac{A_n V_m}{2} [\cos(n\omega_c + \omega_m)t + \cos(n\omega_c - \omega_m)t] \tag{2}$$

Wherein K is the magnitude of the gain of the multiplier and $\omega_c$ and $\omega_m$ are the frequencies of the input signals.

One area in which mixers are used extensively is in cellular communications, for example, in hand-sets. A mixer is provided at the front end of the hand-set in order to down convert a received RF signal (~900 MHz). A mixer is also provided at the transmission end of the hand-set in order to up convert a signal produced by the hand-set, to the RF telecommunications frequency range (~900 MHz). In this way, the signal manipulated by the hand-set can be 100 or 200 MHz in frequency i.e. much lower than the received and transmitted RF signals, making manipulation of the signals in the hand-set easier.

One problem found with Gilbert cell mixer circuits is low input signal handling capability. This is because in a Gilbert cell mixer circuit the input voltage ($V_{BE}$) is applied across the base emitter junction of a transistor, i.e. $V_2$ applied across transistors Q1 and Q2 in FIG. 2. As the transistor's transconductance (gm) is non-linearly related to this voltage the resulting output current ($I_c$) is distorted at higher input voltages. In other words the output current is non-linearly related to the applied voltage, i.e. $\log I_c \propto V_{BE}$.

Another problem found with Gilbert cell mixer circuits is that of high noise. For example, the noise in the Gilbert cell of FIG. 2 is determined by the equation:

$$NOISE = \left(\frac{qI_{EE}}{2}\right)^{0.5} / (gm) \tag{3}$$

Whereas, the noise in a mixer circuit in accordance with the present invention, for example, the circuit of FIG. 7 is given by the equation:

$$NOISE = \left(\frac{qI}{2}\right)^{0.5} / \left(\frac{1}{2R_T} + gm\right) \tag{4}$$

wherein:
NOISE is the input-referred noise voltage (neglecting the contribution from the input termination);
$I_{EE}$ is the tail current (see FIG. 2);
I is the current through the current sink 24 in FIG. 7;
gm is the transistor transconductance;
$R_T$ is the terminating resistance at the RF and IF ports of the mixer; and
the transformer turns ratio is 1:1:1.

It can be seen that the former is larger than the latter until the transconductance becomes large and the two become asymptotically equal. However, for normal operation of a mixer circuit the noise in a Gilbert cell mixer circuit will be larger than that in a mixer circuit in accordance with the present invention.

Furthermore, it is well known in the field of RF circuit design that matching the impedance seen by the RF signal to the impedance of the receiving circuit provides for maximum efficiency in power transmission. Therefore, it is a problem faced by RF circuit designers in the telecommunications field to design receiver circuits which will receive the 900 MHz signal and transmit it to the circuitry of the hand-set while matching the impedances involved. As will be seen below the transformer coupled mixer circuit of the present invention obviates this problem.

SUMMARY OF THE INVENTION

It is an object of the present invention to provide a mixer circuit with better signal handling capability than prior art mixers.

It is another object of the present invention to provide a mixer circuit with less noise than prior art mixers.

It is yet another object of the present invention to provide a mixer circuit which enables impedance matching between the input and output ports of the circuit.

It is a further object of the present invention to provide a mixer circuit which can be implemented as an integrated circuit.

According to a first aspect of the present invention there is provided a transformer-coupled mixer circuit comprising:
a dc voltage supply;
four transistors, arranged as a first transistor pair and a second transistor pair, each having a first transistor and a second transistor and each transistor having a base, a collector and an emitter, the emitter of the first transistor in each transistor pair being connected to the collector of the second transistor in that transistor pair, the emitter of the second transistor in each transistor pair being connected to a current sink; and
a transformer, having a set of primary windings and first and second sets of secondary windings, the first set of secondary windings being connected in series with the emitter of the first transistor in the first transistor pair and the second set of secondary windings being connected in series with the emitter of the first transistor in the second transistor pair, the common connection of the first and second sets of secondary windings being arranged to produce an output signal, the windings being arranged such that the outputs taken from the first and second sets of secondary windings are 180 degrees out of phase, the primary windings of the transformer being arranged to receive an input signal;

the bases of all of the transistors being arranged to receive local oscillator signals, the dc voltage applied to the second transistor in each transistor pair being less than the dc voltage applied to the first transistor in each transistor pair, and the signals applied to the first transistor pair being the inverse of the signals applied to the second transistor pair, such that the local oscillator signals activate only one transistor pair at a time.

Preferably, the voltage drop between the first and second transistors is provided by connecting the base of the first transistor to a terminal of a level shifting transistor and the base of the second transistor to the emitter terminal of the level shifting transistor, in each transistor pair.

Alternatively, the voltage drop between the first and second transistors may be provided by connecting a resistor between the base of the first transistor and the base of the second transistor, in each transistor pair. In this embodiment a capacitor may be connected in parallel with the resistor to provide a high frequency bypass.

Preferably, the local oscillator signals (LO and LOb) are provided via a second transformer, comprising a set of primary windings and first and second sets of secondary windings, the first set of secondary windings of this transformer being connected in series with the base of the first transistor in the first transistor pair and the second set of secondary windings being connected in series with the base of the first transistor in the second transistor pair, the windings being arranged such that outputs taken from the first and second sets of secondary windings are 180 degrees out of phase. In this embodiment the primary windings of the second transformer are connected to a single signal source.

Preferably, a differential output is provided by connecting a pair of mixer circuits as described above, with the primary windings in the two input transformers being arranged such that the input signals in the primary windings of the first transformer in each mixer circuit are 180 degrees out of phase, thus causing the mixer to reject the second harmonic of the local oscillator signal.

Preferably, the transistors are bipolar transistors and the circuit is provided as an integrated circuit.

According to a second aspect of the present invention there is provided a cellular communications device comprising a mixer as hereinbefore described.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENTS

Figure 1:
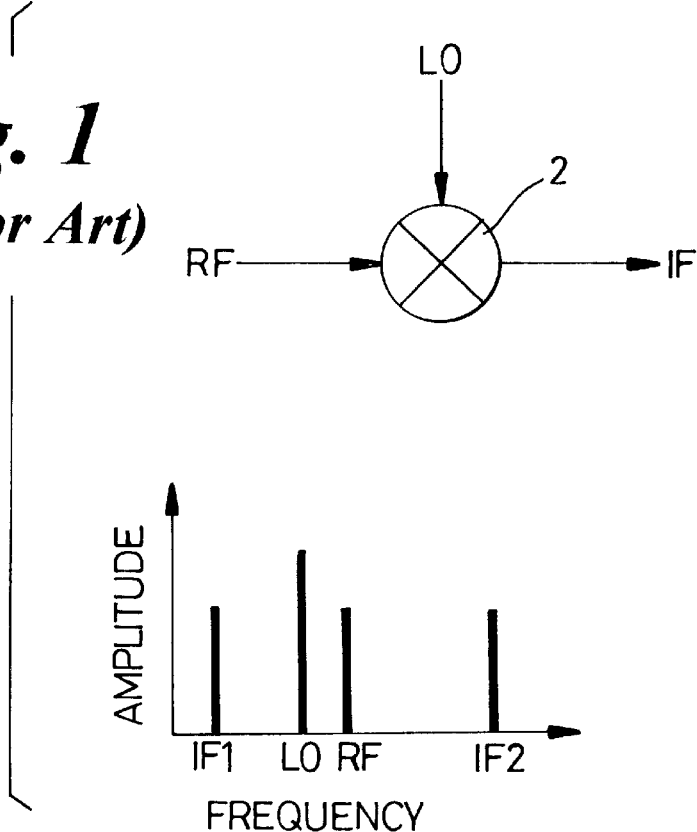
FIG. 1 illustrates the symbol for a mixer circuit and the frequencies of the associated input and output signals.
Figure 2:
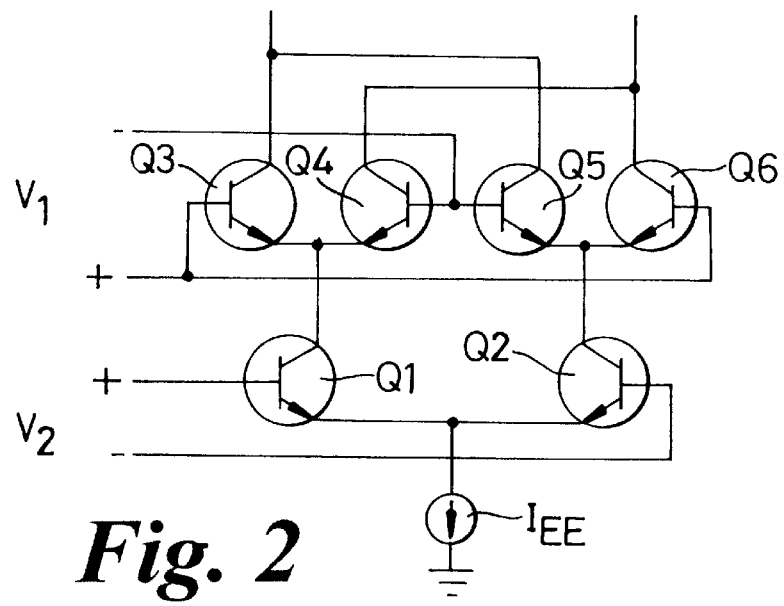
FIG. 2 illustrates a prior art Gilbert cell mixer circuit.
Figure 3:
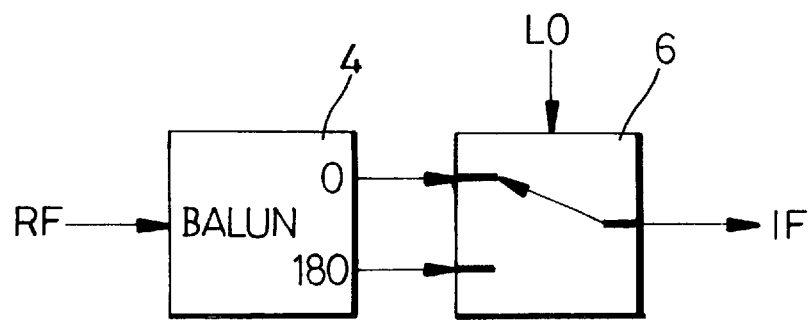
FIG. 3 illustrates a simple conceptual mixer circuit.
Figure 4:
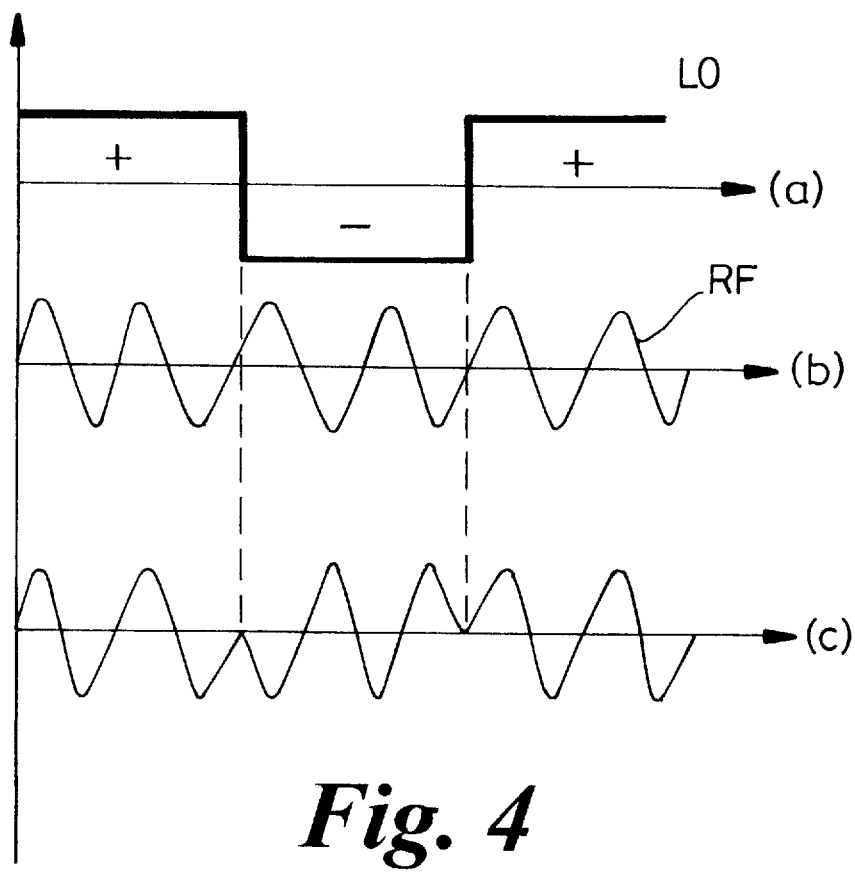
FIG. 4 illustrates (a) the local oscillator (LO) signal and (b) the radio frequency (RF) signal inputs into the conceptual mixer circuit of FIG. 3 and (c) the output of the mixer circuit.

Before discussing the preferred embodiments in detail, it will be beneficial to provide a more conceptual view of the operation of a mixer circuit. FIG. 3 shows a mixer in a conceptual form, in which an input signal (RF) is fed to a balun 4, so that the signal is available in both its original and inverted phases. A switch 6 selects either phase at a rate determined by the local oscillator (LO) signal. The output of this circuit consists of one phase for half the LO period and the inverse phase for the other half of the LO period, as illustrated in FIG. 4. Consequently, the mixer function consists of just a balun and a commutating switch which selects alternate phases of the input signal. An analysis of this output will show that the signal includes components at the sum and difference frequencies of the RF and LO signals, and therefore the circuit provides the function of a mixer circuit.

Figure 5:
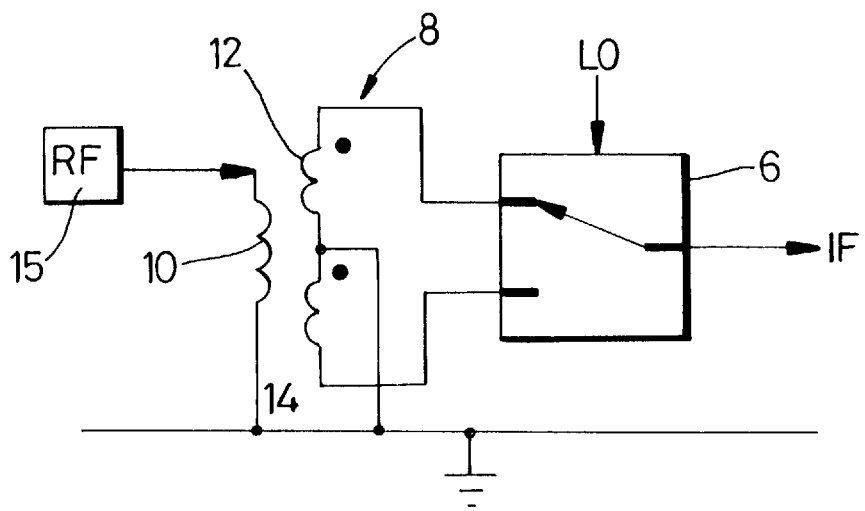
FIGS. 5 and 6 illustrate the conceptual mixer of FIG. 3 wherein the balun is a transformer.

If you consider now the circuit of FIG. 5, the balun of FIG. 3 has been implemented in the form of a transformer 8 having a set of primary windings 10, connected to a source of an input signal RF, and first and second sets of secondary windings 12 and 14 each connected to the switch 6. The polarity of the secondary windings 12 and 14 are arranged such that the output from the first set of windings 12 is the inverse of the output from the second set of windings 14. It can be seen from FIG. 6 that the transformer secondary centre-tap ground connection can be swapped with the switch output with no change of functionality.

Figure 6:
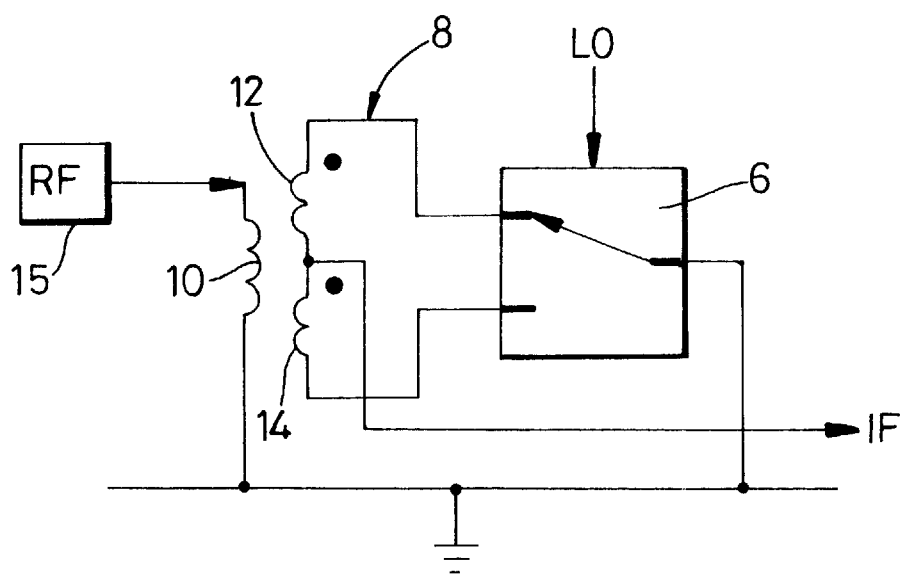
Figure 7:
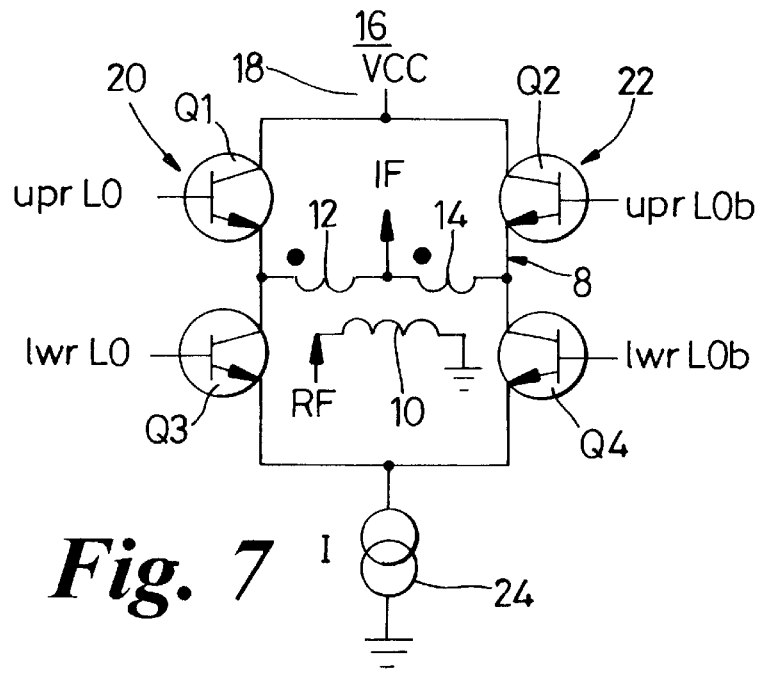
FIG. 7 illustrates a mixer circuit in accordance with the present invention.

FIG. 7 illustrates an embodiment of the mixer of FIG. 6, wherein the switch comprises four transistors Q1, Q2, Q3 and Q4. The mixer circuit 16 illustrated in FIG. 7 is a transformer-coupled mixer circuit comprising a dc voltage supply 18 and said four transistors Q1, Q2, Q3 and Q4, arranged as a first transistor pair 20 comprising transistors Q1 and Q3 and a second transistor pair 22 comprising transistors Q2 and Q4. Each transistor pair has a first transistor Q1 and Q2 and second transistor Q3 and Q4. The emitters Q1E and Q2E of the first transistors Q1 and Q2, in each transistor pair, are connected to the collectors Q3C and Q4C of the second transistors in each transistor pair. In turn the emitters Q3E and Q4E of the second transistors Q3 and Q4 are connected to a current sink 24.

The mixer circuit also comprises a transformer 8, having a set of primary windings 10, connected to a source 15 of an RF signal, and first and second sets of secondary windings 12 and 14. The first set of secondary windings 12 of the transformer 8 are connected in series with the emitter Q1E of the first transistor Q1 in the first transistor pair 20 and the second set of secondary windings 14 is connected in series with the emitter Q2E of the first transistor Q2 in the second transistor pair 22. The sets of secondary windings 12 and 14 are arranged such that output signals (IF) taken therefrom are 180° out of phase. The bases Q1B, Q2B, Q3B and Q4B of the transistors are arranged to receive local oscillator signals. The dc voltage of the local oscillator signals (lwr LO and lwr LOb) applied to the bases Q3B and Q4B of the second transistors Q3 and Q4 in each of the transistor pair 20, 22 is lower than that of the dc voltage of the local oscillator signals (uprLO and uprLOb) applied to bases Q1B and Q2B of the first transistors Q1 and Q2 in each of the transistor pairs. Also, the local oscillator signals (uprLO and lwrLO) in the first transistor pair 20 are the inverse of the local oscillator signals (uprLOb and lwrLOb) in the second transistor pair 22. As will be seen below, this results in the local oscillator signals activating only one of the transistor pairs 20, 22 at a time.

On analysing the transistor pairs 20, 22 it is clear that if the same dc voltage is applied to the bases Q1B and Q3B or Q2B and Q4B of the first and second transistors in each transistor pair, then the second transistors Q3 and Q4 will enter saturated conduction and take large base currents. Consequently, the first transistors Q1 and Q2 will not have the full current (I) available to be steered to their emitters. Moreover, the switching speed of the second transistors Q3 and Q4 will be compromised. Thus, in order to provide sufficient VCE (collector-emitter voltage) to avoid saturation, the voltage applied to the bases Q1B and Q2B of the first transistors Q1 and Q2 must be higher than the voltages applied to the bases Q3B and Q4B of the second transistors Q3 and Q4.

In addition, for an ideal transistor in the on state the emitter presents a resistance of:

$$R_{EE} = (RS + BF/gm)/(1 + BF) \quad (5)$$

wherein:
RS is the source resistance at the base;
BF is the current gain; and
gm is transistor transconductance.

The actual resistance seen at the emitter will be modified by the resistance and capacitance parasitics encountered in a real transistor, but it is nevertheless approximately true up to one tenth of the frequency at which short-circuit common-emitter transistor gain is unity. Therefore, a transistor behaves as a high impedance in the off state and a low, but non-zero, impedance in the on state, i.e. as a useful and effective but non-ideal switch. Therefore, when the transistors Q1 and Q3 in the first transistor pair 20 are activated current will flow and the output signal IF will be provided from the first set of secondary windings 12. At this time, the second transistor pair 22 is switched off, there being no voltage applied to the bases Q2B and Q4B of these transistors. As described above, in this situation the transistor represents a very high impedance and no current flows in either of the transistors Q2 and Q4 and no signal is produced by the second set of secondary windings 14.

Obviously, as the local oscillator signal progresses through its cycle the first transistor pair 20 will be switched on while the second transistor pair 22 is switched off and vice versa. Accordingly, the output signal IF is sequentially provided by the first and then the second set of secondary windings 12 and 14. Hence, the output provided by the circuit of FIG. 7 corresponds to the wave forms shown in FIG. 4, which, as detailed above includes components at frequencies equal to the sum and difference of the frequencies of the input and local oscillator signals RF and LO, and consequently the circuit of FIG. 7 provides the function of a mixer.

This mixer has clear advantages over the Gilbert cell, not least of which is the impedance matching which can be provided by careful selection of the number (N1) of windings in the set primary windings 10 and the number of windings (N2) in either of the sets of secondary windings 12, 14 of the transformer 8. As can be seen from equation (6) the impedance R1 seen by the input signal RF and the impedance R2 seen by the output signal IF are related by the commonly known function for a transformer of:

$$R1/R2 = [N1/N2]^2 \quad (6)$$

Hence the circuit provides impedance matching and will enable highly efficient power transfer in an RF circuit, such as the receiver and transmitter circuits of a cellular communications device, as discussed above.

Also, as the balun in the mixer circuit in accordance with the present invention is a transformer, which is an inherently low noise device, the mixer circuit will provide improved noise suppression over that of the prior art Gilbert cell mixer circuit, as discussed above.

Again as was discussed above, the collector current of a transistor is non-linearly related to the voltage $V_{BE}$ applied to the base/emitter junction of the transistor. In the Gilbert cell mixer the input signal is applied across the base/emitter junction alone and consequently this nonlinearity is extremely detrimental, resulting in poor signal handling capability. However, in a mixer in accordance with the present invention the signal is applied across either the base/emitter junction of the first transistor Q1 in the first transistor pair 20 and the first set of secondary windings 12 in series or across the base/emitter junction of the first transistor Q2 in the second transistor pair 22 and the second set of secondary windings 14 in series. Therefore, as the impedance of both the first and the second sets of secondary windings 12 and 14 is large in comparison with the effective resistance seen at the emitter, the effect of the non-linearity in this effective emitter resistance will be minimised and the signal handling capabilities of the mixer circuit will be enhanced.

Figure 8:
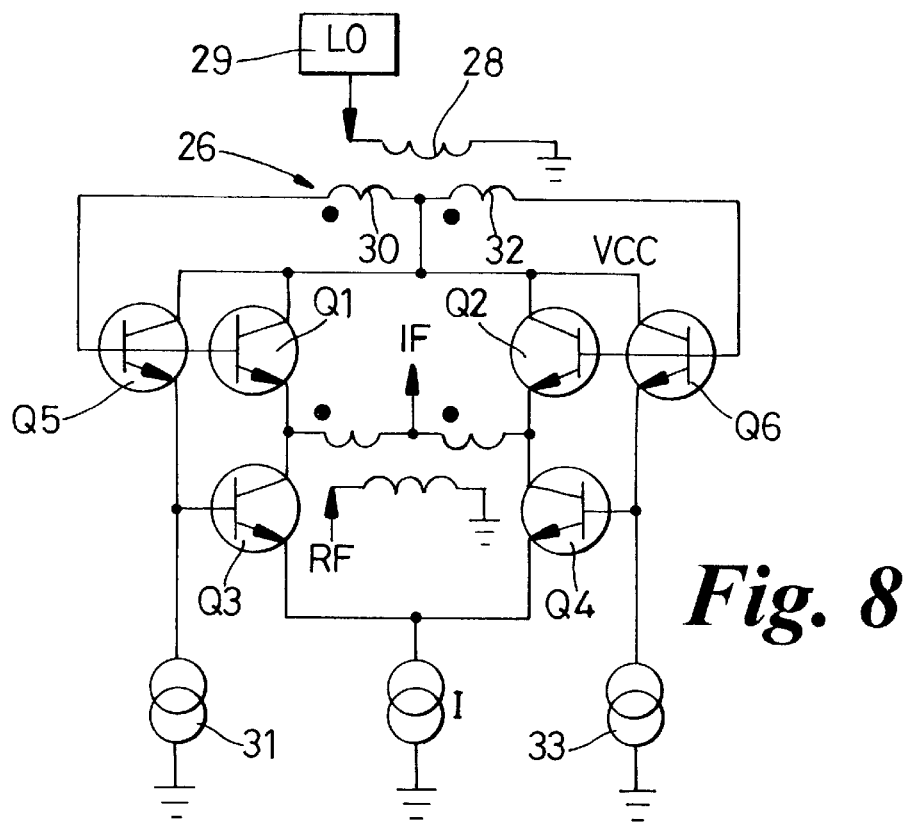
FIG. 8 illustrates a first implementation of the mixer of FIG. 7.

FIG. 8 illustrates an embodiment of the present invention in which the voltage difference between the first and second transistors Q1 and Q3 in the first transistor pair 20 is provided by connecting the base Q1B of the first transistor Q1 to a terminal of a level shifting transistor Q5 and connecting the base Q3B of the second transistor Q3 to the emitter terminal of the transistor Q5. In this way the base Q3B of transistor Q3 will be maintained at a voltage at least one p-n junction drop, i.e. 0.6–0.8 volts, below that of the base Q1B of the first transistor Q1. It can be seen from FIG. 8 that a second level shifting transistor Q6 is connected in the same manner as transistor Q5, to perform the same function with respect to the first transistor Q2 and the second transistor Q4 of the second transistor pair 22.

In addition, in FIG. 8 the local oscillator signal LO and the inverse signal LOb are provided via a second transformer 26. The second transformer 26 has a set of primary windings 28 which is connected to a signal source 29, in the form of a voltage-controlled oscillator (VCO). The transformer 26 also has first and second set of secondary windings 30 and 32 the first of which is connected to the base Q5B of the level shifting transistor Q5 in the first transistor pair 20. The second set of secondary windings 32 is connected to the base Q6B of the level shifting transistor Q6B of the level shifting transistor Q6 in the second transistor pair 22. The polarities of the secondary windings 30 and 32 are arranged such that the signal LO applied to the base Q5B of transistor Q5 in the first transistor pair 20 is the inverse of the signal LOb applied to the base Q6B of the transistor Q6 in the second transistor pair 22. Therefore, in this way the transformer 26 provides both the LO and LOb signals from a single signal source 29 connected to the primary windings 28 of the second transformer 26. Consequently, the use of the transformer 26 provides a cost advantage over prior art circuits in which two active devices are utilised to provide the local oscillator signals LO and LOb. In addition, with mixer circuits intended for use above approximately 500 MHz, such as those used in cellular communications hand sets, both of the transformers 8 and 26 can be fabricated, along with the remaining components of the mixer circuit, as an integrated circuit.

Figure 9:
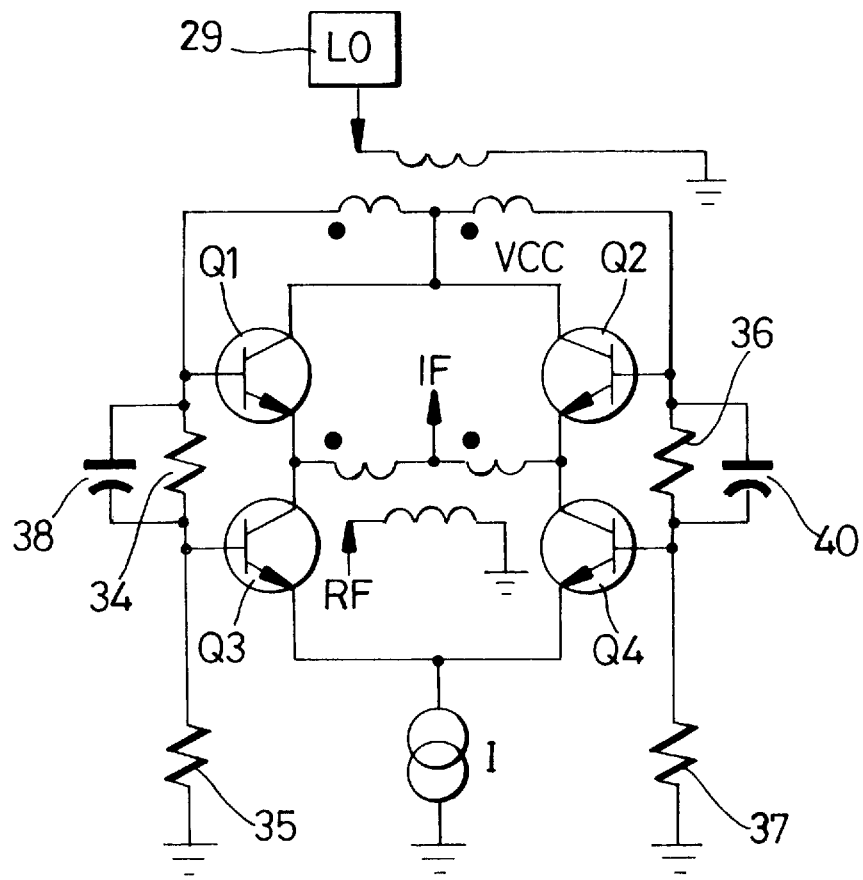
FIG. 9 illustrates a second implementation of the mixer of FIG. 7.

FIG. 9 illustrates a second embodiment of the invention, in which the level shifting transistor Q5 and associated current sink 31 has been replaced by resistors 34 and 35 and the level shifting transistor Q6 and associated current sink 33 has been replaced by resistors 36 and 37, in order to provide the required voltage drop between the bases Q1B and Q3B of the transistors Q1 and Q3 in the first transistor pair 20 and the bases Q2B and Q4B of the transistors Q2 and Q4 in the second transistor pair 22. In addition, ac-bypass capacitors 38 and 40 are provided in parallel with the resistors 34 and 36 respectively, in order to preserve good high frequency response. This mixer circuit functions in the same manner as the circuit illustrated in FIG. 8 and will therefore not be described further herein.

The circuits of FIGS. 5–7 exhibit cancellation (to a first order) of the fundamental component of the LO at the RF port for equal amplitude LO signals at the bases. This occurs because deltaVBE34 (the difference in voltage between the bases of Q3 and Q4) sets up an on/off current ratio given by:

$$deltaVBE34 = (kT/q)\log_e(Ion/Ioff)$$

where $$Ion + Ioff = I$$

This current ratio is imposed on Q1 and Q2 which develop deltaVBE1(on-off) such that:

$$deltaVBE1(on-off) = deltaVBE2(on-off) = deltaVBE34$$

For Q1, this means that a voltage increment on the base is matched by an increment in the emitter current which cancels the tendency of the emitter voltage to rise with the base. A similar argument holds for Q2. After this first order cancellation, the residual LO signals remaining in the two secondaries of the transformer are coupled to the RF port via the primary winding where they combine constructively and appear as unwanted LO leakage. However, at the IF port, these signals combine destructively so that there is very little LO fundamental left. This combination is non-linear and produces the second harmonic of the LO which appears at the IF port.

Figure 10:
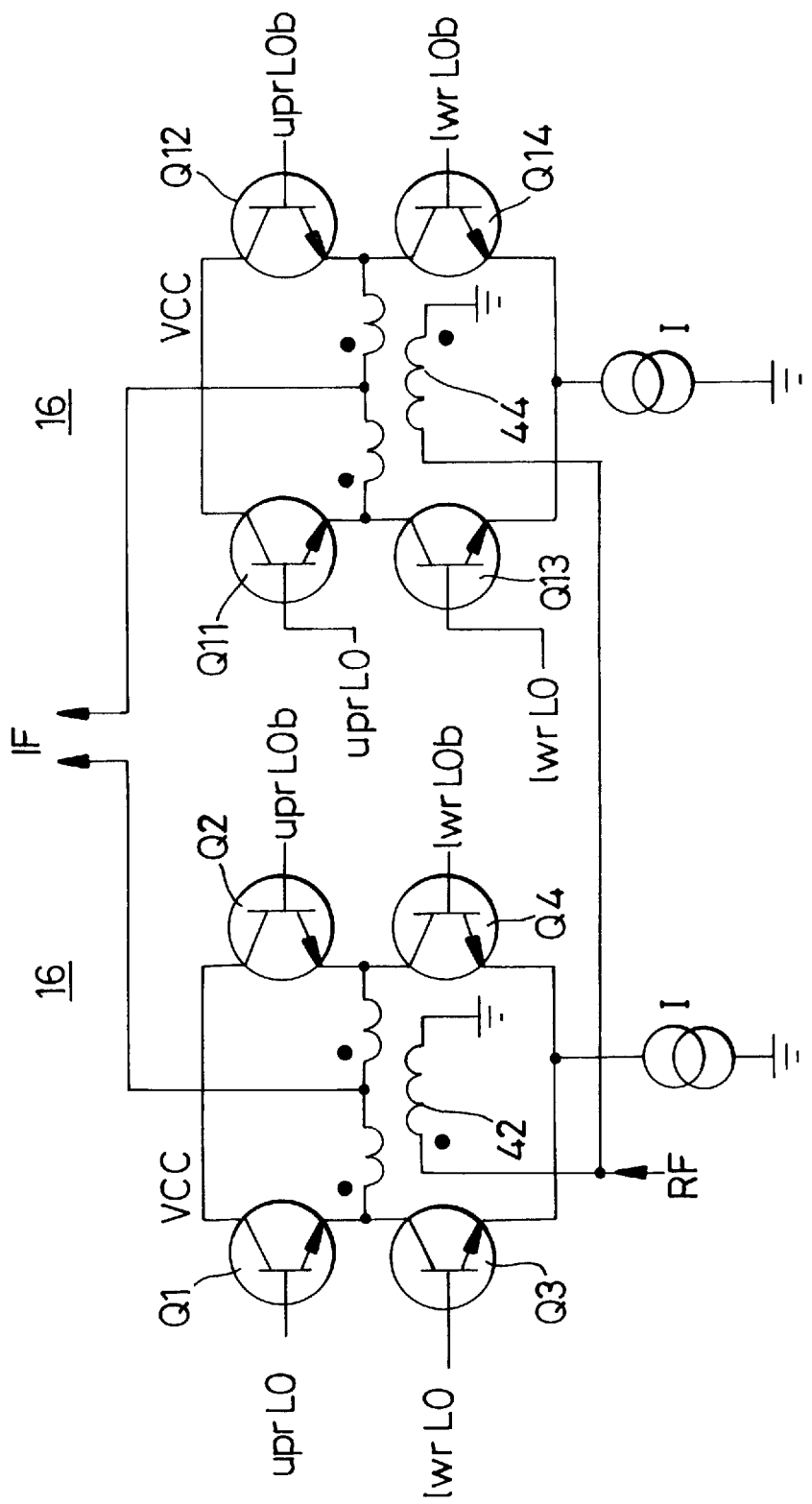
FIG. 10 illustrates two of the mixer circuits of FIG. 7 arranged to provide a differential output.

The circuit of FIG. 10 provides a further measure of rejection of the LO fundamental at the RF port due to its differential configuration in which two mixer circuits 16, as illustrated in FIG. 7, are combined. The primary winding 42 in the first mixer circuit and the primary winding 44 in the second mixer of FIG. 10 are arranged to have opposite polarities such that when the residual LO fundamental from the secondaries is coupled to both of these sets of primary windings 42 and 44, they combine destructively hence rejecting the LO fundamental. At the IF ports taken individually, the second harmonic of the LO is present as discussed above. However, the opposite polarity connection of the primary windings 42 and 44 produces IF signals of opposite phase. Hence, by taking the IF output from the IF ports differentially, the second harmonic of the LO appears as a common-mode signal which is rejected. Apart from the connection of the primary windings 42 and 44 the mixer circuits in FIG. 10 are identical to those of FIG. 7 and operate as discussed above.

In summary, the invention provides a mixer circuit which provides high signal handling capability, low noise and impedance matching. In addition the mixer circuit can be fabricated as an integrated circuit.

Modifications may be incorporated without departing from the scope or spirit of the present invention.

We claim:

1. A transformer-coupled mixer circuit comprising:

a dc voltage supply;

four transistors, arranged as a first transistor pair and a second transistor pair, each having a first transistor and a second transistor and each transistor having a base, a collector and an emitter, the emitter of the first transistor in each transistor pair being connected to the collector of the second transistor in that transistor pair, the emitter of the second transistor in each transistor pair being connected to a current sink; and a transformer, having a set of primary windings and first and second sets of secondary windings, the first set of secondary windings being connected to the emitter of the first transistor in the first transistor pair and the second set of secondary windings being connected to the emitter of the first transistor in the second transistor pair, a common connection of the first and second sets of secondary windings being arranged to produce an output signal, the windings being arranged such that outputs taken from the first and second sets of secondary windings are 180 degrees out of phase, the primary windings of the transformer being arranged to receive an input signal;

the bases of all of the transistors being arranged to receive local oscillator signals, the dc voltage applied to the second transistor in each transistor pair being less than the dc voltage applied to the first transistor in each transistor pair, and the signals applied to the first transistor pair being the inverse of the signals applied to the second transistor pair, such that the local oscillator signals activate only one transistor pair at a time.

2. The mixer of claim 1, wherein a voltage drop between the first and second transistors is provided by connecting the base of the first transistor to the base of a level shifting transistor and the base of the second transistor to the emitter terminal of the level shifting transistor, in each transistor pair.

3. The mixer of claim 1, wherein a voltage drop between the first and second transistors is provided by connecting a resistor between the base of the first transistor and the base of the second transistor, of each transistor pair.

4. The mixer of claim 3, wherein a capacitor is connected in parallel with the resistor to provide a high frequency bypass.

5. The mixer of claim 1, wherein the local oscillator signals are provided via a second transformer.

6. The mixer of claim 5, wherein the second transformer comprises a set of primary windings and first and second sets of secondary windings, the first set of secondary windings of the second transformer being connected to the base of the first transistor in the first transistor pair and the second set of secondary windings of the second transformer being connected to the base of the first transistor in the second transistor pair, the windings of the second transformer being arranged such that outputs taken from the first and second sets of secondary windings of the second transformer are 180 degrees out of phase.

7. The mixer of claim 6, wherein the primary windings in the second transformer are connected to an input signal from a single signal source.

8. A pair of mixers, each as defined in claim 5, wherein the outputs of the respective mixers form a differential output, with the primary windings in the two input transformers arranged such that the input signals are 180 degrees out of phase, thus causing the mixer to reject the second harmonic of the local oscillator signal.

9. The mixer of claim 1, wherein the circuit is provided as an integrated circuit.

* * * * *